United States Patent
Teo et al.

(10) Patent No.: US 7,809,339 B1
(45) Date of Patent: Oct. 5, 2010

(54) VOLTAGE REGULATOR FOR HIGH PERFORMANCE RF SYSTEMS

(75) Inventors: Swee-Ann Teo, Sunnyvale, CA (US); Lawrence Tse, Fremont, CA (US); Yonghua Song, Saratoga, CA (US)

(73) Assignee: Marvell International Ltd., Hamilton (BM)

( * ) Notice: Subject to any disclaimer, the term of this patent is extended or adjusted under 35 U.S.C. 154(b) by 799 days.

(21) Appl. No.: 11/715,027

(22) Filed: Mar. 7, 2007

Related U.S. Application Data

(63) Continuation of application No. 10/747,522, filed on Dec. 29, 2003, now Pat. No. 7,190,936.

(60) Provisional application No. 60/470,620, filed on May 15, 2003.

(51) Int. Cl.
*H04B 1/04* (2006.01)
*H04B 7/00* (2006.01)

(52) U.S. Cl. .............. 455/127.1; 455/127.2; 455/241.1

(58) Field of Classification Search .............. 455/127.1, 455/127.2, 241.1, 126, 253.2, 91; 323/272, 323/280, 281; 363/72
See application file for complete search history.

(56) References Cited

U.S. PATENT DOCUMENTS

| | | | |
|---|---|---|---|
| 4,359,679 A * | 11/1982 | Regan | 323/272 |
| 4,766,364 A | 8/1988 | Biamonte et al. | |
| 5,175,488 A | 12/1992 | Moroney | |
| 6,130,526 A * | 10/2000 | Yang et al. | 323/272 |
| 6,246,221 B1 | 6/2001 | Xi | 323/280 |
| 6,529,563 B1 | 3/2003 | Mosinskis et al. | |
| 6,765,374 B1 | 7/2004 | Yang et al. | 323/280 |
| 6,806,690 B2 | 10/2004 | Xi | 323/273 |
| 7,030,595 B2 | 4/2006 | Akita | 323/280 |
| 7,174,534 B2 * | 2/2007 | Chong et al. | 717/105 |
| 7,514,909 B2 * | 4/2009 | Burstein et al. | 323/272 |
| 7,522,436 B2 * | 4/2009 | Schultz et al. | 363/72 |
| 7,616,463 B2 * | 11/2009 | Burstein | 363/72 |
| 2005/0057234 A1 | 3/2005 | Yang et al. | 323/273 |
| 2005/0190475 A1 | 9/2005 | Poss | 360/46 |
| 2005/0208909 A1 | 9/2005 | Maya et al. | 455/127 |

FOREIGN PATENT DOCUMENTS

EP 0942531 A2 9/1999

OTHER PUBLICATIONS

ANSI/IEEE Std. 802.11, 1999 Edition; Part 11: Wireless LAN Medium Access Cntrol (MAC) and Physical Layer (PHY) Specifications; Information technology—Telecommunications and information exchange between systems—Local and metropolitan area networks—Specific requirements; pp. 1-512.

(Continued)

*Primary Examiner*—Sonny Trinh

(57) ABSTRACT

A voltage regulator comprises a master regulator circuit that receives a reference signal and that generates a feedback signal and a master bias signal. The master bias signal is based on the reference signal and the feedback signal. N slave regulator circuits receive the master bias signal from the master regulator circuit and output N regulated output signals to N circuits, respectively, where N is an integer greater than one.

27 Claims, 4 Drawing Sheets

OTHER PUBLICATIONS

IEEE P802.11g/D8.2 Apr. 2003 (Supplement to ANSI/IEEE std. 802.11 1999(Reaff 2003)) Draft Supplement Standard for Part 11: Wireless LAN Medium Access Cntrol (MAC) and Physical Layer (PHY) Specifications; Information technology—Telecommunications and information exchange between systems—Local and metropolitan area networks—Specific requirements; Further Higher Data Rate Extension in the 2.4 GHz Band; pp. 1-69.

IEEE Std. 802.11a-1999; Supplement to IEEE Standard for Information Technology—Telecommunications and information exchange between systems—Local and metropolitan area networks—Specific requirements; Part: 11 Wireless LAN Medium Access Control (MAC) and Physical Layer (PHY) specifications; High-speed Physical Layer in the 5 GHz Band; pp. 1-83.

IEEE Std. 802.11b; Supplement to IEEE Standard for Information technology—Telecommunications and information exchange between systems—Local and metropolitan area networks—Specific requirements; Part 11: Wireless LAN Medium Access Control (MAC) and Physical Layer (PHY) specifications: Higher-Speed Physical Layer Extension in the 2.4 GHz Band; Approved Sep. 16, 1999; pp. 1-89.

IEEE Std. 802.11b-1999/Cor 1-2001;IEEE Standard for Information technology-Telecommunications and information exchange between systems— Local and metropolitan area networks—Specific requirements; Part 11: Wireless LAN Medium Access Cntrol (MAC) and Physical Layer (PHY) Specifications; Amendment 2: Higher-speed Physical Layer (PHY) extension in the 2.4 GHz band—Corrigendum 1; pp. 1-15.

IEEE Std. 802.16; IEEE Standard for Local and metropolitan area networks; Part 16: Air Interface for Fixed Broadband Wireless Access Systems; Apr. 8, 2002; pp. 1-322.

IEEE Std. 802.16a; IEEE Standard for Local and metropolitan area networks; Part 16: Air Interface for Fixed Broadband Wireless Access Systems—Amendment 2: Medium Access Control Modifications and Additional Physical Layer Specifications for 2-11 GHz; Apr. 1, 2003; pp. 1-292.

IEEE Std. 802.16; IEEE Standard for Local and Metropolitan Area Networks; Part 16; Air Interface for Fixed Broadband Wireless Access Systems, 802.16 IEEE Standard for Local and Metropolitan Area Networks, Oct. 1, 2004, pp. i-xxxiv and pp. 1-857, IEEE Std. 802.16-2004, IEEE, United States.

* cited by examiner

VOLTAGE REGULATOR FOR HIGH PERFORMANCE RF SYSTEMS

CROSS-REFERENCE TO RELATED APPLICATIONS

This application is a continuation of U.S. patent application Ser. No. 10/747,522 filed on Dec. 29, 2003, which application claims the benefit of U.S. Provisional Application No. 60/470,620, filed on May 15, 2003. The disclosures of the above applications are incorporated herein by reference.

FIELD OF THE INVENTION

The present invention relates to voltage regulators, and more particularly to voltage regulators for high performance radio frequency (RF) systems.

BACKGROUND OF THE INVENTION

Circuits in high performance radio frequency (RF) systems such as but not limited to wireless communications devices often require a regulated supply voltage. Voltage regulators are typically used to regulate the supply voltage. In some RF systems, more than one voltage regulator may be required. In other applications with spatial limitations, multiple circuits may share the same voltage regulator. For example, a voltage-controlled oscillator (VCO) circuit and a mixer circuit may share the same regulated supply. In this configuration, noise from the mixer circuit often appears at the output of the VCO circuit and vice-versa.

Referring now to FIG. 1, an exemplary voltage regulator 10 includes an operational amplifier (opamp) 12 and a PMOS transistor 14. An inverting input of the opamp 12 receives a reference voltage signal 16 and a non-inverting input of the opamp 12 receives a feedback signal 18. The opamp 12 generates an output voltage signal 20 that is based on a difference between the reference voltage signal 16 and the feedback signal 18.

The output voltage signal 20 is input to a gate of the PMOS transistor 14. A source of the PMOS transistor 14 is connected to a supply voltage 22. A drain of the PMOS transistor 14 is connected to the non-inverting input of the opamp 12 to provide the feedback signal 18. The voltage regulator 10 outputs a regulated signal 26 to an RF subcircuit 28 of a RF system 30. When supplying a single RF subcircuit 28, the regulated signal 26 is stable and constant. When a single voltage regulator supplies more than one RF subcircuit, noise or crosstalk from one of the RF sub-circuits may appear in the output of the other RF sub-circuit.

Referring now to FIG. 2, separate voltage regulators may be used for each subcircuit to eliminate the noise. The RF circuit 30 includes n RF subcircuits 28-1, . . . , 28-$n$ that require voltage regulation. Voltage regulators 10-1, . . . , 10-$n$ are provided for each RF subcircuit 28-1, . . . , 28-$n$, respectively. The voltage regulators 10-1, . . . , 10-$n$ include opamps 12-1, . . . , 12-$n$, and transistors 14-1, . . . , 14$n$, respectively. Feedback signals 18-1, . . . , 18-$n$ are generated as described above. When multiple voltage regulators 10-1, . . . , 10$n$ are used, the spatial requirements and current dissipation of the RF system 30 increase.

SUMMARY OF THE INVENTION

A voltage regulator according to the present invention includes a master regulator circuit that receives a reference signal, that generates a master bias signal and that includes a transistor having a first gain. A first slave regulator circuit includes a first transistor having a second gain that is substantially equal to unity gain, a control terminal that receives the master bias signal from the master regulator circuit, a first terminal and a second terminal that outputs a first regulated output signal. A second slave regulator circuit includes a second transistor having a third gain that is substantially equal to unity gain, a control terminal that receives the master bias signal from the master regulator circuit, a first terminal, and a second terminal that outputs a second regulated output signal.

In other features, the master regulator circuit includes an opamp having a non-inverting input that receives the reference signal, an inverting input and an output. The output of the opamp generates the master bias signal, which is output to a control terminal of the transistor.

In yet other features, the master regulator circuit includes a current source. A second terminal of the transistor communicates with the current source and the inverting input of the opamp. The transistor includes a first terminal. The first terminals of the transistor, the first transistor and the second transistor are biased by a first voltage potential.

In still other features, the transistor, the first transistor and the second transistor are NMOS transistors. The first gain is greater than unity gain.

In still other features, a Radio Frequency (RF) circuit includes the voltage regulator, a first RF subcircuit that receives the first regulated output signal, and a second RF subcircuit that receives the second regulated output signal. The RF circuit is a wireless communications device.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

Figure 2:
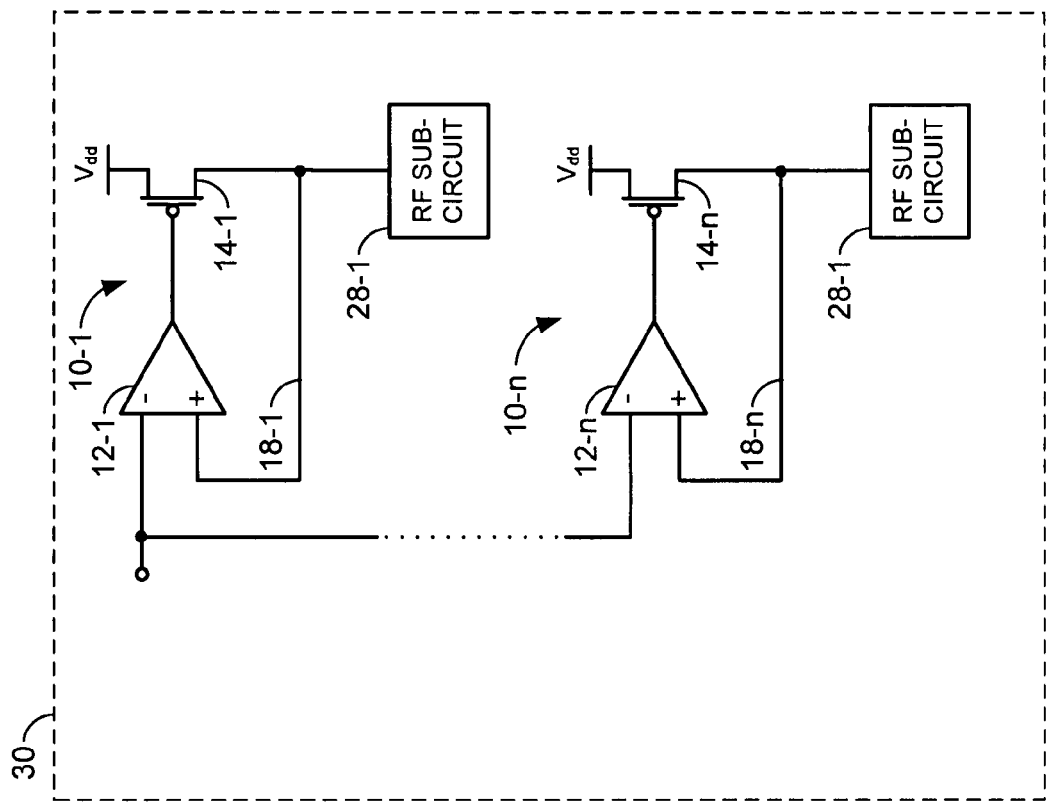
FIG. 2 is a schematic of an RF circuit with multiple RF subcircuits and voltage regulators with feedback circuits according to the prior art.

The following description of the preferred embodiment(s) is merely exemplary in nature and is in no way intended to limit the invention, its application, or uses. For purposes of clarity, the same reference numbers will be used in the drawings to identify similar elements.

Figure 3:
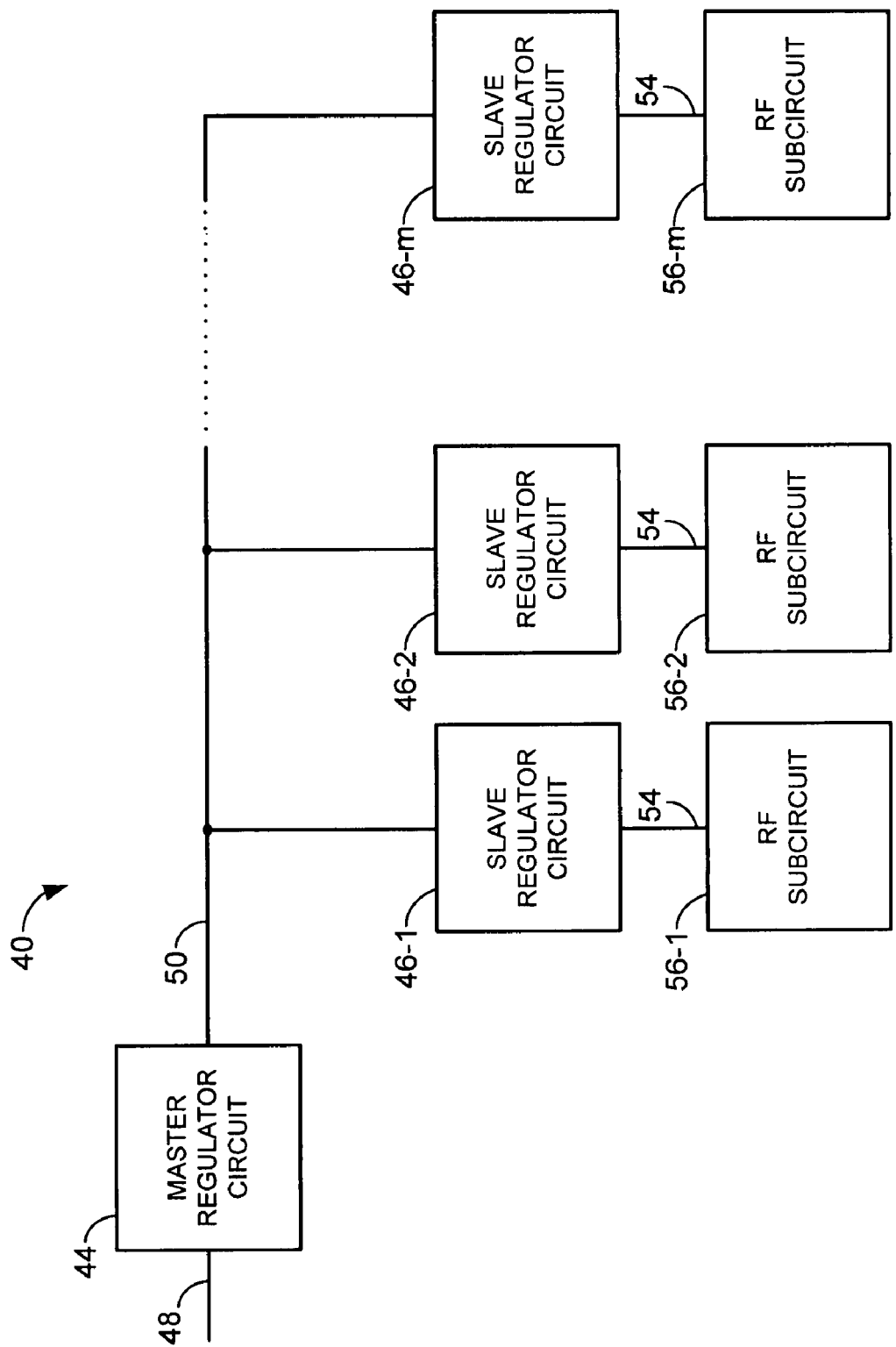
FIG. 3 is a functional block diagram of a voltage regulator with a master and multiple slave regulator circuits according to the present invention.

Referring now to FIG. 3, a voltage regulator 40 includes a master regulator circuit 44 and one or more slave regulator circuits 46-1, 46-2, . . . , and 46-$m$ (collectively identified as slave regulator circuits 46). The master regulator circuit 44 receives a reference voltage signal 48 and generates a master bias signal 50, as will be described below. The slave regulator circuits 46 receive the master bias signal 50 from the master regulator circuit 44. The slave regulator circuits 46 output a regulated signal 54 based on the master bias signal 50. RF subcircuits 56-1, 56-2, . . . , and 56-m (collectively identified as RF subcircuits 56) receive the regulated signal 54. Because the desired supply voltage for the RF subcircuit 56 is sensed and adjusted at the master regulator circuit 44, the slave regulator circuits 46 operate as level shifters and unity gain buffers and have feedback. The slave regulator circuits 46 have a second gain that is substantially equal to unity gain. As used herein, the term substantially equally to unity gain means a gain that is greater than 0.5 and less than 2.

Figure 4:
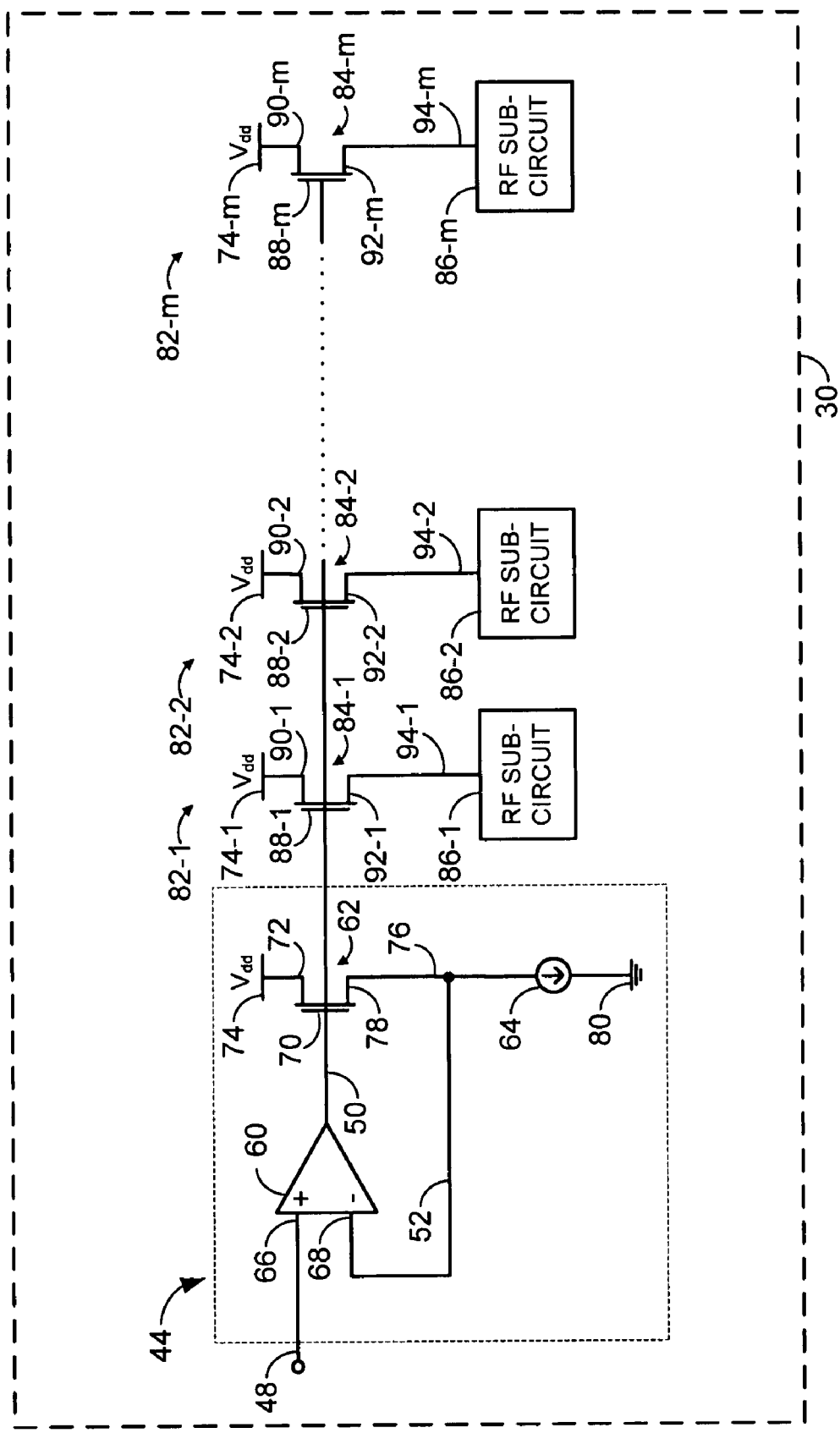
FIG. 4 is an electric schematic of the voltage regulator of FIG. 3.

Referring now to FIG. 4, the master regulator circuit 44 includes an opamp 60, a first NMOS transistor 62, and a current source 64. The reference voltage signal 48 communicates with a non-inverting input 66 of the opamp 60. The opamp 60 outputs the master bias signal 50, which biases a gate terminal 70 of the first NMOS transistor 62. A drain terminal 72 of the first NMOS transistor 62 communicates with a supply voltage 74. A source terminal 78 of the first NMOS transistor 62 communicates with an inverting input 68 of the opamp 60 to provide a feedback signal 52 and with the current source 64, which is referenced to a ground potential 80.

The master bias signal 50 is regulated based on a difference between the reference voltage signal 48 and the feedback signal 52. The master bias signal 50 is output to slave regulator circuits 82-1, 82-2, . . . , 82-m. The slave regulator circuits 82-1, 82-2, . . . , 82-m include second NMOS transistors 84-1, 84-2, . . . , 84-m. The slave regulator circuits 82-1, 82-2, . . . , 82-m provide a regulated signal to RF subcircuits 86-1, 86-2, . . . , 86-m of the RF system 30. The master bias signal 50 biases gates 88-1, 88-2, . . . , 88-m of the second NMOS transistors 84-1, 84-2, . . . , 84-m. Drain terminals 90-1, 90-2, . . . , 90-N of the second NMOS transistors 84-1, 84-2, . . . , 84-m communicate with a supply voltage 74-1, 74-2, . . . , 74-m. Source terminals 92-1, 92-2, . . . , 92-m of the second NMOS transistors 84-1, 84-2, . . . , 84-m output a regulated supply voltage signal 94-1, 94-2, . . . , 94-m to the RF subcircuits 86-1, 86-2, . . . , 86-m. In this arrangement, the second NMOS transistors 84-1, 84-2, . . . , 84-m act as source followers.

Figure 1:
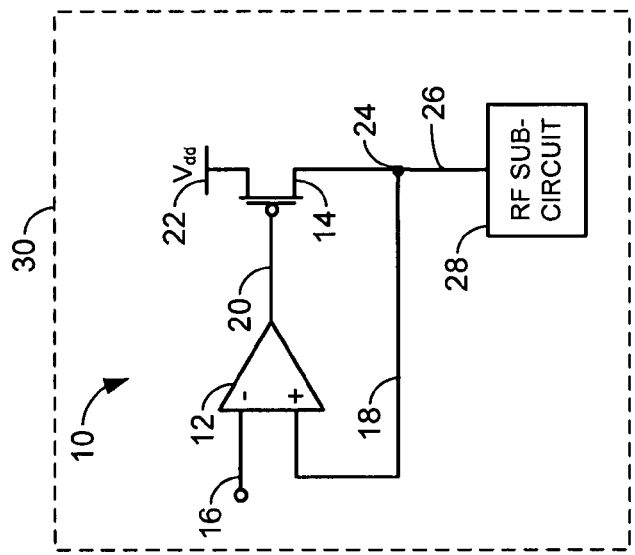
FIG. 1 is a schematic of an exemplary voltage regulator according to the prior art.

The regulated supply voltage 94-1, 94-2, . . . , 94-m is based on a difference between the reference voltage signal 48 and the feedback signal 52, which is generated in the master regulator circuit 44. Because the second NMOS transistors 84-1, 84-2, . . . , 84-m have substantially unity gain, the slave regulator circuits 82-1, 82-2, . . . , 82-m act as unity gain buffers for the master control voltage signal 50. In conventional regulator circuits shown in FIGS. 1 and 2, a small change in the output signal 20 can significantly impact the regulated signal 26 that is input to the circuit blocks 28 because the PMOS transistor 14 does not have unity gain.

Figure 5:
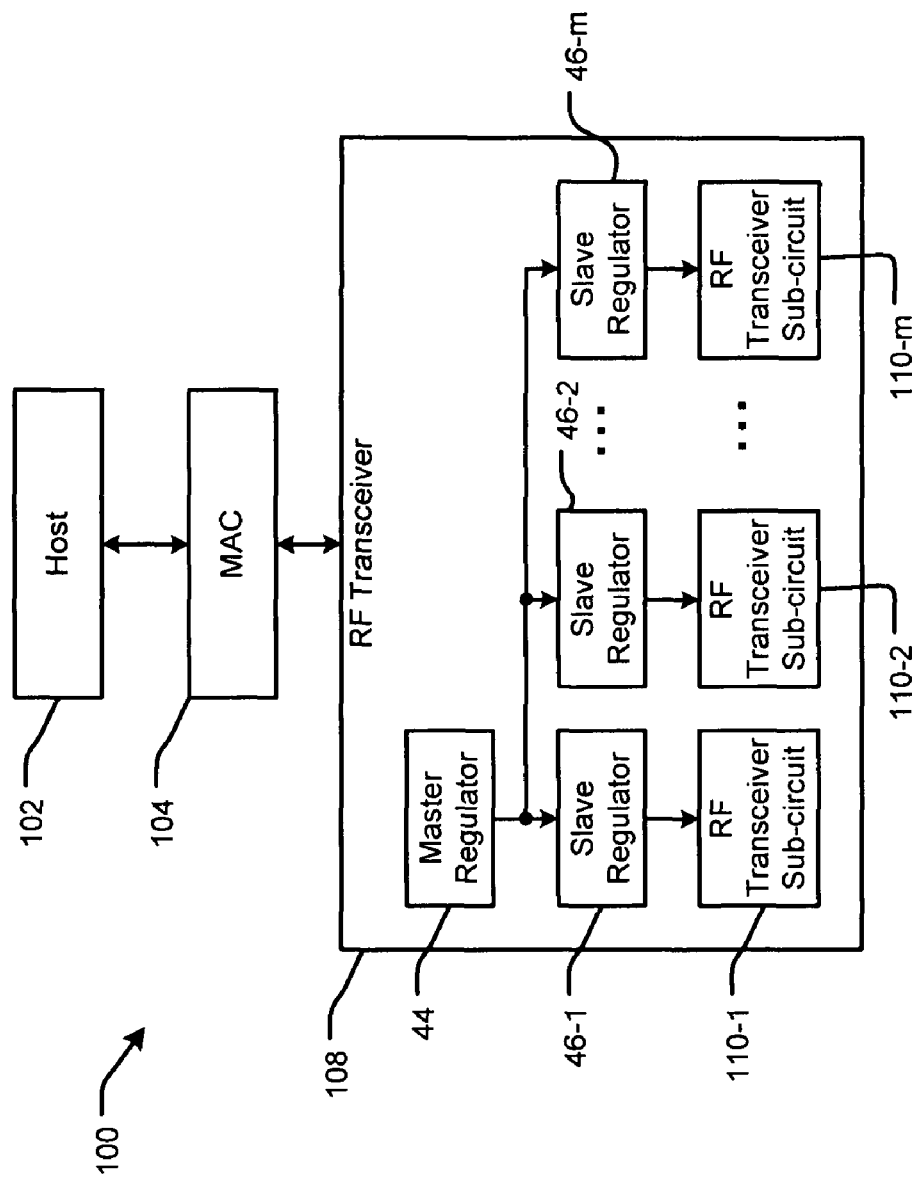
FIG. 5 is a functional block diagram of the voltage regulator of FIG. 3 implemented in an RF transceiver of a wireless communications device.

Referring now to FIG. 5, the master regulator 44 and slave regulators 46-1, 46-2, . . . , 46-m can be used in wireless communication devices. In one implementation, a wireless communications device 100 is connected to a host device 102 such as but not limited to a desktop computer, a personal digital assistant (PDA), a laptop computer, a gaming console, an access point and the like. The wireless communications device 100 further includes a medium access control (MAC) device 104 and an RF transceiver 108. The master regulator 44 and slave regulators 46-1, 46-2, . . . , and 46-m supply regulated outputs to RF subcircuits 110-1, 110-2, . . . , and 110-m of the RF transceiver 108. In one implementation, the wireless communications device is compliant with at least one of IEEE 802.11, 802.11a, 802.11g, 802.11n, and/or 802.16, which are hereby incorporated by reference in their entirety, although other existing and future wireless standards may be used.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A voltage regulator, comprising:
   a master regulator circuit (i) that receives a reference signal and (ii) that generates a feedback signal and a master bias signal, wherein the master bias signal is based on the reference signal and the feedback signal, and wherein the master regulator circuit includes a master transistor; and
   N slave regulator circuits (i) that receive the master bias signal from the master regulator circuit and (ii) that output N regulated output signals to N circuits, respectively, where N is an integer greater than one, wherein the N slave regulator circuits each include a first transistor having a first gain and a first control terminal receiving the master bias signal.

2. The voltage regulator of claim 1, wherein the first gain is substantially equal to unity gain.

3. The voltage regulator of claim 1, wherein first terminals of the master transistor and the first transistor are biased by a first voltage potential.

4. The voltage regulator of claim 1, wherein the master transistor and the first transistor include NMOS transistors.

5. The voltage regulator of claim 1, wherein the first gain is greater than unity gain.

6. A Radio Frequency (RF) circuit comprising:
   the voltage regulator of claim 1; and
   the N circuits that receive the N regulated output signals.

7. A wireless communications device comprising the RF circuit of claim 6, wherein the wireless communications device is compliant with at least one of IEEE 802.11, 802.11a, 802.11g, 802.11n, and 802.16.

8. A voltage regulator, comprising:
   a master regulator circuit (i) that receives a reference signal and (ii) that generates a feedback signal and a master bias signal, wherein the master bias signal is based on the reference signal and the feedback signal, wherein the master regulator circuit includes
      a master transistor; and,
      an amplifier having a first input that receives the reference signal,
      a second input that receives the feedback signal, and
      an output that generates the master bias signal and communicates with a control terminal of the master transistor; and
   N slave regulator circuits (i) that receive the master bias signal from the master regulator circuit and (ii) that output N regulated output signals to N circuits, respectively, where N is an integer greater than one.

9. The voltage regulator of claim 8,
   wherein the master regulator circuit includes a current source, and
   wherein a second terminal of the master transistor communicates with the current source and the second input of the amplifier.

10. A Radio Frequency (RF) circuit, comprising:
a voltage regulator that comprises:
- a master regulator circuit (i) that receives a reference signal and (ii) that generates a master bias signal, wherein the master regulator circuit includes a master transistor; and
- N slave regulator circuits (i) that receive the master bias signal from the master regulator circuit and (ii) that output N regulated output signals, respectively; and
- N RF subcircuits that receive the N regulated output signals, respectively, where N is an integer greater than one, wherein the N slave regulator circuits each include (i) a first transistor having a first gain and (ii) a first control terminal receiving the master bias signal.

11. The RF circuit of claim 10, wherein the master regulator circuit includes:
the master transistor;
an amplifier having a first input that receives the reference signal; and
a second input and an output that generates the master bias signal and communicates with a second control terminal of the master transistor.

12. The RF circuit of claim 11,
wherein the master regulator circuit includes a current source, and
wherein a second terminal of the master transistor communicates with the current source and the second input of the amplifier.

13. The RF circuit of claim 10, wherein the first gain is substantially equal to unity gain.

14. The RF circuit of claim 10, wherein first terminals of the master transistor and the first transistor are biased by a first voltage potential.

15. The RF circuit of claim 10, wherein the master transistor and the first transistor include NMOS transistors.

16. The RF circuit of claim 10, wherein the first gain is greater than unity gain.

17. A wireless communications device comprising the RF circuit of claim 10, wherein the wireless communications device is compliant with at least one of IEEE 802.11, 802.11a, 802.11g, 802.11n, and 802.16.

18. A voltage regulator, comprising:
a master regulator circuit comprising:
a master transistor that generates a feedback signal;
an amplifier (i) that receives a reference signal and the feedback signal and (ii) that generates a master bias signal based on the reference signal and the feedback signal; and
N slave regulator circuits (i) that receive the master bias signal from the master regulator circuit and (ii) that output N regulated output signals to N circuits, respectively, where N is an integer greater than one.

19. The voltage regulator of claim 18, wherein the N slave regulator circuits each include a first transistor having a first gain.

20. The voltage regulator of claim 19, wherein the first gain is substantially equal to unity gain.

21. The voltage regulator of claim 19,
wherein the master transistor includes a first terminal, and
wherein first terminals of the master transistor and the first transistor are biased by a first voltage potential.

22. The voltage regulator of claim 19, wherein the master transistor and the first transistor include NMOS transistors.

23. The voltage regulator of claim 19, wherein the first gain is greater than unity gain.

24. The voltage regulator of claim 18, wherein the amplifier includes:
a first input that receives the reference signal,
a second input that receives the feedback signal, and
an output that generates the master bias signal and communicates with a control terminal of the master transistor.

25. The voltage regulator of claim 24,
wherein the master regulator circuit includes a current source, and
wherein a second terminal of the master transistor communicates with the current source and an inverting input of the amplifier.

26. A Radio Frequency (RF) circuit comprising:
the voltage regulator of claim 18, and
the N circuits that receive the N regulated output signals.

27. A wireless communications device comprising the RF circuit of claim 26, wherein the wireless communications device is compliant with at least one of IEEE 802.11, 802.11a, 802.11g, 802.11n, and 802.16.

* * * * *